US00RE40005E

(19) United States
(12) Reissued Patent
Kutscher et al.

(10) Patent Number: US RE40,005 E
(45) Date of Reissued Patent: Jan. 15, 2008

(54) COATED CUTTING INSERT

(75) Inventors: Asa Kutscher, Alvsjo (SE); Kenneth Westergren, Hagersten (SE); Björn Ljungberg, Enskede (SE); Anders Lenander, Tyresö (SE)

(73) Assignee: Sandvik Intellectual Property AB, Sandviken (SE)

(21) Appl. No.: 11/449,887

(22) Filed: Jun. 9, 2006

Related U.S. Patent Documents

Reissue of:
(64) Patent No.: 5,945,207
Issued: Aug. 31, 1999
Appl. No.: 08/923,922
Filed: Sep. 5, 1997

(30) Foreign Application Priority Data

Sep. 6, 1996 (SE) ..... 9603264

(51) Int. Cl.
*C23C 16/30* (2006.01)

(52) U.S. Cl. ..... 428/216; 51/307; 51/309; 407/119; 428/212; 428/698; 428/336; 428/701; 428/702; 428/469; 428/472; 428/323; 428/325

(58) Field of Classification Search ..... 402/119; 51/307, 309; 428/212, 216, 336, 698, 469, 428/472, 323, 325, 701
See application file for complete search history.

(56) References Cited

U.S. PATENT DOCUMENTS

| | | | |
|---|---|---|---|
| 5,135,801 | A | 8/1992 | Nystrom et al. |
| 5,310,605 | A | 5/1994 | Baldoni, II et al. |
| 5,380,408 | A | 1/1995 | Svensson |
| 5,453,241 | A | 9/1995 | Akerman et al. |
| 5,487,625 | A | 1/1996 | Ljungberg et al. |
| 5,652,045 | A | 7/1997 | Nakamura et al. |
| 5,654,035 | A | 8/1997 | Ljungberg et al. |
| 5,674,564 | A | 10/1997 | Ljungberg et al. |
| 5,766,782 | A | 6/1998 | Ljunberg et al. |

FOREIGN PATENT DOCUMENTS

| | | |
|---|---|---|
| EP | 693574 | 7/1985 |
| EP | 0 594 875 | 5/1994 |
| EP | 685572 | 3/1995 |
| EP | 0 653 499 | 5/1995 |
| EP | 0 709 484 | 5/1996 |
| JP | 6 108 254 | 4/1994 |

OTHER PUBLICATIONS

Patent Abstracts of Japan, abstract of JP, A, 60110840, published Jun. 17, 1985.

English Translation of JP 25282–1978.

*Primary Examiner*—Archene Turner
(74) *Attorney, Agent, or Firm*—Drinker Biddle & Reath LLP

(57) ABSTRACT

There is disclosed a coated cutting insert particularly useful for cutting in cast iron materials. The insert is characterized by a straight WC-Co cemented carbide body having a highly W-alloyed Co binder phase, a well-defined surface content of Co and a coating including an innermost layer of $TiC_xN_yO_z$ with columnar grains, a layer of a fine-grained, textured $Al_2O_3$ layer and a top layer of $TiC_xN_yO_z$ that has been removed along the cutting edge line.

14 Claims, 1 Drawing Sheet

COATED CUTTING INSERT

Matter enclosed in heavy brackets [ ] appears in the original patent but forms no part of this reissue specification; matter printed in italics indicates the additions made by reissue.

*CROSS-REFERENCES TO RELATED APPLICATIONS*

*The present application is a reissue of U.S. Pat. No. 5,945,207, which claims the benefit of priority to Swedish Application No. 9603264-4 filed Sep. 6, 1996.*

BACKGROUND OF THE INVENTION

The present invention relates to a coated cutting tool (cemented carbide insert) particularly useful for the machining of cast iron parts by turning.

Cast iron materials may be divided into two main categories, grey cast iron and nodular cast iron. Cast iron materials typically often have an outer layer of cast skin, which may contain various inclusions of sand, rust and other impurities and also a surface zone which is decarburized and contains a larger amount of ferrite than the rest of the material.

The wear when machining grey cast iron materials with $Al_2O_3$-coated cutting tools is dominated by chemical, abrasive and so-called adhesive wear. In order to protect the cutting tool against chemical wear, it is desirable to use as thick $Al_2O_3$ layers as possible. This is contradicted by the properties regarding adhesive wear that this type of layer generally possesses. Adhesive wear occurs when fragments or individual grains of the layer are pulled away from the cutting edge by the work piece chip formed. The surface zone with high amounts of ferrite particularly puts severe demands on the adhesive properties of the coating and in combination with the inclusions in the cast skin on the work piece, causes notch wear at the depth of cut on the main cutting edge.

Another feature in the machining of grey cast iron is its sensitivity to excessive amounts of Co binder phase in the interface between the cemented carbide cutting insert and the coating. Excessive amounts of Co binder phase deteriorate the adhesion between coating and cemented carbide and lead to flaking of the coating during machining.

Swedish Application 9502640-7 (which corresponds to U.S. Ser. No. 08/675,034, our reference 024444-233) discloses a coated cutting insert tool of a cemented carbide body of a composition 5-11 weight % Co, <10 weight %, preferably 1.5-7.5 weight %, cubic carbides of the metals Ti, Ta and/or Nb and balance WC, especially suited for machining of low alloyed steel components by turning.

OBJECTS AND SUMMARY OF THE INVENTION

It is an object of this invention to avoid or alleviate the problems of the prior art.

It is further an object of this invention to provide a coated cutting tool particularly useful for the machining of cast iron parts by turning.

In one aspect of the invention there is provided a cutting tool insert comprising a coating and a cemented carbide body, said cemented carbide body comprising WC, 5-10 weight % Co and <0.5 weight % cubic carbides of metals from groups IVb, Vb, or VIb of the periodic table with a highly W-alloyed binder phase having a CW-ratio of 0.8-0.9 and a surface composition of the cemented carbide body being well-defined, the amount of Co on the surface being within −4 weight % to +4 weight % of the nominal Co content of the body and said coating comprising:

a first, innermost, layer of $TiC_xN_yO_z$ with x+y+z=1 and y>x and z<0.1 with a thickness of 0.1-2 μm, and with equiaxed grains having a size <0.5 a layer of $TiC_xN_yO_z$ where x+y+z=1, and z=0, x>0.3 and y>0.3, with a thickness of 5-10 μm with columnar grains having a diameter of <2 μm;

a layer of $TiC_xN_yO_z$ where x+y+z=1, z<0.5 and x>y with a thickness of 0.1-2 μm and with equiaxed or needle-like grains having a size <0.5 μm;

a layer of smooth, texture, fine-grained $\alpha$-$Al_2O_3$ having a grain size of 0.5-2 μm with a thickness of 3-6 μm; and an outer layer of $TiC_xN_yO_z$ where x+y+z=1, z<0.05 with a thickness of 0.5-3 μm and a grain size <1 μm, the outer coating layer having been removed in at least the edge line so that the $Al_2O_3$ layer is on top along the cutting edge line and the outer layer of $TiC_xN_yO_z$ is the top layer on the clearance side.

In another aspect of the invention there is provided a method of making a cutting insert comprising a cemented carbide body and a coating wherein a WC-Co-based cemented carbide body is sintered, said sintering including a cooling step which at least to below 1200° C. is performed in a hydrogen atmosphere of pressure 0.4-0.9 bar and thereafter coating said sintered body with a first, innermost, layer of $TiC_xN_yO_z$ with a thickness of 0.1-2 μm, with equiaxed grains with size <0.5 μm by CVD;

a layer of $TiC_xN_yO_z$ with a thickness of 4-12 μm with columnar grains and with a diameter of <5 μm deposited by MTCVD technique, using acetonitrile as the carbon and nitrogen source for forming the layer in a temperature range of 850°-900° C.;

a layer of $TiC_xN_yO_z$ with a thickness of 0.1-2 μm with equiaxed or needle-like grains with size <0.5 μm, using CVD;

a layer of a smooth textured $\alpha$-$Al_2O_3$ textured in the direction (012), (104) or (110) with a thickness of 3-8 μm using CVD; and an outer layer of $TiC_xN_yO_z$ with a thickness of 0.5-3 μm, using CVD and thereafter removing the outer layer of $TiC_xN_yO_z$ on at least the cutting edge line so that the $Al_2O_3$ layer is on top along the cutting edge line and the outer layer of $TiC_xN_yO_z$ is the top layer on the clearance side of the cutting insert.

BRIEF DESCRIPTION OF THE DRAWINGS

The Figure is a micrograph in 2000× magnification of a coated insert according to the present invention in which A—cemented carbide body B—$TiC_xN_yO_z$ layer with equiaxed grains C—$TiC_xN_yO_z$ layer with columnar grains D—$TiC_xN_yO_z$ layer with equiaxed or needle-like grains E—textured $Al_2O_3$ layer with columnar-like grains F—TiN layer

DETAILED DESCRIPTION OF THE PREFERRED EMBODIMENTS OF THE INVENTION

Figure 1:
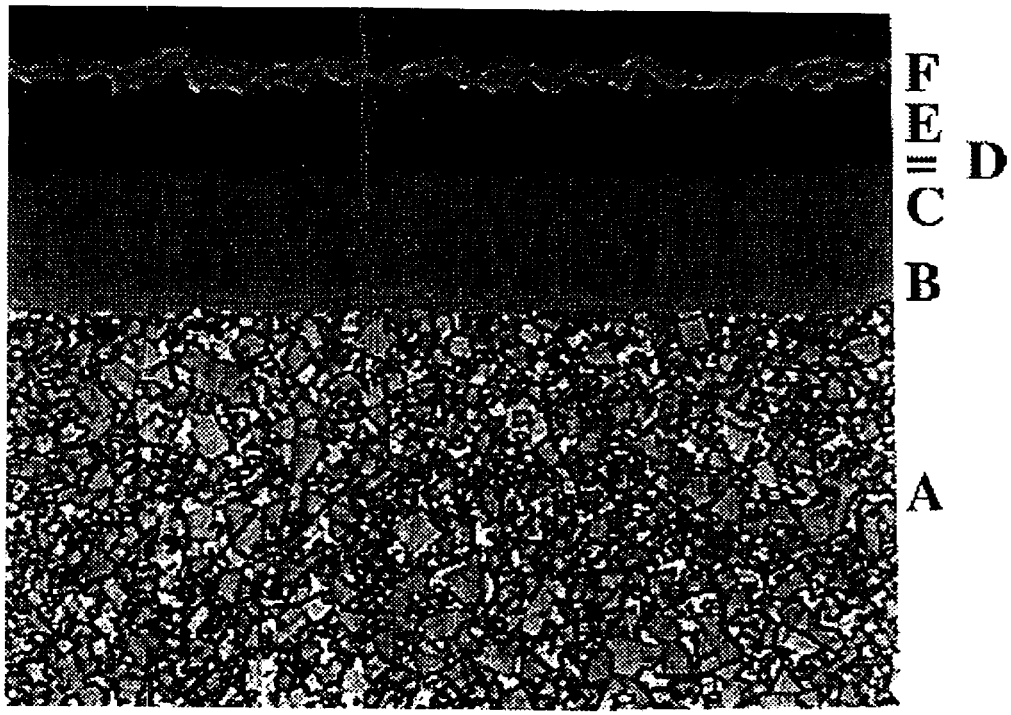

It has surprisingly been found that by combining the following features: a cemented carbide body with a highly W-alloyed binder phase, a low content of cubic carbides and a well-defined surface composition resulting from a specific sintering process, a columnar $TiC_xN_yO_z$ layer, a textured $\alpha$-$Al_2O_3$ layer, a TiN layer, fulfilling the demands of easy identification of used edges, and a post-treatment of the coating cutting edge by brushing, an excellent cutting tool for machining of cast iron materials, especially grey cast iron, can be obtained.

According to the present invention, a cutting tool insert is provided with a cemented carbide body of a composition 5-10 weight % Co, preferably 5-8 weight % Co, <2 weight %, preferably <0.5 weight %, most preferably 0 weight % cubic carbides of the metals Ti, Ta and/or Nb and balance WC. The grain size of the WC is in the range of 1-2.5 μm. The cobalt binder phase is highly alloyed with W. The content of W in the binder phase can be expressed as the $$\text{CW-ratio}=M_s/(\text{weight \% Co}\times 0.0161),$$

where $M_s$ is the measured saturation magnetization of the cemented carbide body in [kA/m] $hAm^2/kg$ and weight % Co is the weight percentage of Co in the cemented carbide. The CW-value is a function of the W content in the Co binder phase. A low CW-value corresponds to a high W-content in the binder phase.

It has now been found according to the present invention that improved cutting performance is achieved, if the cemented carbide body has a CW-ratio of 0.75-0.93, preferably 0.80-0.90. The cemented carbide body may contain small amounts, <1 volume %, of eta phase ($M_6C$), without any detrimental effect.

The surface composition of the cemented carbide insert is well-defined and the amount of Co on the surface is within −4 weight % to +4 weight % of the nominal content.

Alternatively, the cemented carbide according to the present invention consists of WC and Co and has an about 100-350 μm wide, preferably 150-300 μm wide, binder phase depleted surface zone in which the binder phase content increases continuously and in a non-step-wise manner without maximum up to the nominal content of the binder phase in the inner portion of the cemented carbide body. The average binder phase content in a 50 μm surface zone is 25%-75%, preferably 40%-60%, of the nominal binder phase content.

The coating comprises a first, innermost, layer of $TiC_xN_yO_z$ with x+y+z=1, preferably y>x and z<0.1, most preferably y>0.8 and z=0, with a thickness of 0.1-2 μm, and with equiaxed grains with size <0.5 μm. In an alternative embodiment, the $TiC_xN_yO_z$ layer preferably has the composition z<0.5 and y<0.1, most preferably 0.1<z<0.5 and y=0;

a layer of $TiC_xN_yO_z$ with x+y+z=1, preferably with z=0, x>0.3 and y>0.3, most preferably x>0.5, with a thickness of 4-12 μm, preferably 5-10 μm, most preferably 6-9 μm with columnar grains and with a diameter of <5 μm, preferably <2 μm;

a layer of $TiC_xN_yO_z$, with x+y+z=1, with z<0.5, preferably x>y, most preferably x>0.5 and 0.1<z<0.4, with a thickness of 0.1-2 μm and with equiaxed or needle-like grains with size <0.5 μm, this layer being the same as or different from the innermost layer;

a layer of textured, fine-grained (with average grain size 0.5-2 μm) $\alpha$-$Al_2O_3$ layer with a thickness of 3-8 μm, preferably 3-6 μm; and an outer layer of $TiC_xN_yO_z$. This $TiC_xN_yO_z$ layer comprises one or more layers with the composition x+y+z=1, z<0.05, preferably y>x. Alternatively, this outer layer can be a multilayer of TiN/TiC/TiN in one or several sequences and a total thickness of 0.5-3 μm, preferably 1-2 μm. This layer exhibits a grain size <1 μm.

In order to obtain a smooth cutting edge line suitable for machining, the edge of the coated insert is subjected to a brushing treatment giving a surface roughness $R_{max}\leqq 0.4$ μm over a length of 10 μm according to the method described in Swedish Application No. 9402543-4 (which corresponds to U.S. Ser. No. 08/497,934, our reference 024444-144). This treatment removes the top layer of $TiC_xN_yO_z$ along the cutting edge line. It is also within the scope of this invention that the surface might be smoothed by a wet blasting treatment.

Furthermore, as disclosed in U.S. Pat. No. 5,654,035 or Swedish Applications 9304283-6 (which corresponds to U.S. Ser. No. 08/348,084, our reference 024444-092) or 9400089-0 (which corresponds to U.S. Ser. No. 08/366,107, our reference 024444-093), the $\alpha$-$Al_2O_3$ layer has a preferred crystal growth orientation in either the (104)-, (012)- or (110)-direction, preferably in the (012)-direction, as determined by X-ray Diffraction (XRD) measurements. A Texture Coefficient (TC) can be defined as:

$$TC(hkl)=\frac{I(hkl)}{I_o(hkl)}\left\{\frac{1}{n}\sum\frac{I(hkl)}{I_o(hkl)}\right\}^{-1}$$

where

I(hkl)=measured intensity of the (hkl) reflection $I_o$(hkl)=standard intensity of the ASTM standard powder pattern diffraction data n=number of reflections used in the calculation, (hkl)

reflections used are: (012), (104), (110), (113), (024), (116)

TC for the set of (012), (104) or (110) crystal plans should be larger than 1.3, preferably larger than 1.5.

According to the method of the present invention, a WC-Co-based cemented carbide body having a highly W-alloyed binder phase with a CW-ratio of 0.75-0.93, preferably 0.8-0.9, is subjected to a conventional sintering process and removing the surface cobalt by etching as disclosed in U.S. Pat. No. 5,380,408. Alternatively, for cemented carbide consisting of WC and Co cooling at least to below 1200° C. may be performed in a hydrogen atmosphere of pressure 0.4-0.9 bar as disclosed in Swedish Application 9602750-3 (which corresponds to International Application No. PCT/SE97/01231).

The insert is coated with a first, innermost, layer of $TiC_xN_yO_z$ with x+y+z=1, preferably y>x and z<0.1, most preferably y>0.8 and z=0, with a thickness of 0.1-2 μm, and with equiaxed grains with size <0.5 μm. In an alternative embodiment, the $TiC_xN_yO_z$ layer preferably has the composition z<0.5 and y<0.1, most preferably 0.1<z<0.5 and y=0;

a layer of $TiC_xN_yO_z$, with x+y+z=1, preferably with z0, x>0.3 and y>0.3, most preferably x>0.5, with a thickness of 4-12 μm, preferably 5-10 μm, with columnar grains and with a diameter of <5 μm, preferably <2 μm, deposited preferably by MTCVD technique (using acetonitrile as the carbon and nitrogen source for forming the layer in the temperature range of 700-900° C.). The exact conditions, however, depend to a certain extent on the design of the equipment used;

a layer of $TiC_xN_yO_z$, with x+y+z=1, with z<0.5, preferably x>y, most preferably x>0.5 and 0.1<z<0.4, with a thickness of 0.1-2 μm and with equiaxed or needle-like grains with size <0.5 μm, using known CVD methods, this layer being the same as or different from the innermost layer;

an intermediate layer of a smooth textured $\alpha$-$Al_2O_3$ according to U.S. Pat. No. 5,654,035 or Swedish Applications 9304283-6 or 9400089-0 with a thickness of 3-8 μm, preferably 3-6 μm; and an outer layer of $TiC_xN_yO_z$, comprising one or several individual layers each with composition x+y+z=1 and z<0.05, preferably y>x. Alternatively, this outer layer comprises a multilayer of TiN/TiC/TiN in one or several sequences. The total coating thickness of these outer layers is 0.5-3.0 μm, preferably 0.5-2 μm. The grain size in this outer layer is <1.0 μm.

The edge line of the inserts in smoothed, e.g., by brushing the edges based on, e.g., SiC, as disclosed in Swedish Application 9402543-4.

When a $TiC_xN_yO_z$ layer with z>0 is desired, $CO_2$ and/or CO are/is added to the reaction gas mixture.

The invention is additionally illustrated in connection with the following Examples which are to be considered as illustrative of the present invention. It should be understood, however, that the invention is not limited to the specific details of the Examples.

EXAMPLE 1

Inserts are made as follows:

A. Cemented carbide cutting tool inserts of style CNMG 120412-KM with the composition 6.0 weight % Co and balance WC are sintered in a conventional way at 1410° C. and cooled down to 1200° C. in 0.6 bar $H_2$ giving inserts with a binder phase highly alloyed with W, corresponding to a CW-ratio of 0.085 and a Co-content on the surface corresponding to 7 weight % as measured with Energy Dispersive Spectroscopy. After conventional ER-treating, the inserts are coated with a 0.5 μm equiaxed $TiC_xN_yO_z$ layer, x=0.1, y=0.9, z=0 and an average grain size of about 0.2 μm, followed by a 8.0 μm thick $TiC_xN_yO_z$ layer, x=0.55, y=0.45, with columnar grains with an average grain size of 2.5 μm, by using MTCVD technique (process temperature 850° C. and $CH_3CN$ as the carbon/nitrogen source). In subsequent process steps during the same coating cycle, a 1 μm thick layer of $TiC_xN_yO_z$ (about x=0.6, y=0.2 and z=0.2) with equiaxed grains and an average grain size of 0.2 μm is deposited followed by a 5.0 μm thick layer of (012)-textured $\alpha$-$Al_2O_3$, with average grain size of about 1.2 μm, deposited according to conditions given in U.S. Pat. No. 5,654,035. On top of the $\alpha$-$Al_2O_3$ layer, TiN/TiC/TiN/TiC/TiN is deposited in a multilayer structure with a total coating thickness of 1.5 μm, the average grain size <0.3 μm in each individual layer. Finally, the inserts are subjected to a brushing treatment in which the cutting edge lines are smoothed with a 320 mesh brush containing SiC as grinding material, the outer TiN/TiC multilayer is removed by the brushing treatment along the cutting edge line.

B. Cemented carbide cutting tool inserts of style CNMG 120412-KM with the composition 6.0 weight % Co and balance WC are coated under the procedure described for insert A. The cemented carbide body has a CW-ratio of 0.88 and is subjected to a conventional sintering without $H_2$ during the cooling step. Prior to the coating process, the inserts are subjected to surface cleaning involving an electrolytic etching process according to U.S. Pat. No. 5,380,408. The Co content on the insert surface is about 5 weight % as measured with Energy Dispersive Spectroscopy. The cemented carbide has an about 250 μm wide binder phase depleted surface zone in which the binder phase content increased continuously and in a non-step-wise manner without maximum up to the nominal content of the binder phase in the inner portion of the cemented carbide. The average binder phase content in a 25 μm surface zone is 3 weight %. The inserts are subjected to the same final brushing treatment as for insert A.

C. Cemented carbide cutting tool inserts of style CNMG 120412-KM from the same batch as in insert A are coated with a 4 μm equiaxed layer of TiC with grain size <2.0 μm, followed by a 6 μm thick layer of $Al_2O_3$ according to prior art technique. XRD analysis shows that the $Al_2O_3$ layer consists of a mixture of $\alpha$- and $\kappa$-$Al_2O_3$, in the ratio of about 60/40, the $\alpha$-$Al_2O_3$ showing no preferred growth orientation as measured by XRD. The grain size of the $\kappa$-$Al_2O_3$ is 2.0 μm while the $\alpha$-$Al_2O_3$ exhibited grains up to 5.5 μm.

D. Cemented carbide cutting tool inserts from the same batch as insert C. The inserts are subjected to a wet blasting treatment after coating.

E. Cemented carbide cutting tool inserts of style CNMG 120412-KM from the same batch as insert A are coated with a 2 μm equiaxed layer of $TiC_xN_yO_z$, the average grain size of this layer is 0.2 μm, followed by a 8 μm thick columnar TiCN deposited according to prior art technique, the grain size in this coating being about 3.0 μm and a 6 μm thick layer of (012)-textured $\alpha$-$Al_2O_3$ deposited according to the same process conditions as for insert A. The inserts are subjected to the same brushing treatment as insert A prior to machining.

F. Cemented carbide cutting tool inserts of style CNMG 120412-KM with the composition of 6 weight % Co, 4 weight % cubic carbides and balance WC are subjected to the same coating process as in insert A. The CW-ratio of the inserts is 0.88, they are subjected to a sintering process using $H_2$ during the cooling step, and the Co content on the surface is 9% as measured by Energy Dispersive Spectroscopy. The inserts are subjected to the same final brushing treatment as insert A.

G. Cemented carbide cutting inserts of style CNMG 120412-KM with the composition of 6.0 weight % Co and balance WC are coated under the procedure described for insert E. The cemented carbide has a CW-ratio of 0.98 and the inserts are subjected to a conventional sintering without $H_2$ during the cooling step. The inserts are ER-treated and cleaned in conventional processes. The Co content on the surface prior to coating is 30 weight % as measured with Energy Dispersive Spectroscopy. The inserts are subjected to the same final brushing treatment as in insert A.

The inserts are tested in a facing operation. The workpiece material is nodular cast iron, SS717. The workpiece shape causes intermittent cutting conditions during each revolution. Cutting speed is 250 m/min, feed 0.10 mm/rev and cutting depth is 2.0 mm. The operation is performed using coolant.

This type of operation typically causes severe flaking of the coating. The coating is torn off the insert in fragments. The wear can be measured as the part of the edge line on which the coating has flaked off compared to the total length of the edge line used in the cutting operation.

| Insert Type | % of Edge Line with Flaking |
|---|---|
| A | <5 |
| B | <5 |
| C | 100 |
| D | 70 |
| E | 25 |
| F | 20 |
| G | 50 |

EXAMPLE 2

Inserts of type A, B, D and E in Example 1 above are tested in an intermittent cutting operation in grey cast iron, SS0125. The cutting conditions put high demands on the flaking resistance of the coating as well as the chemical and abrasive wear resistance of the coating. The shaping of the work piece is such that for each revolution, two entrances in the work piece will be made giving intermittent cutting conditions. Cutting speed is 300 m/min, cutting feed is 0.25 mm/rev and cutting depth is 2.0 mm. The machining is made without using any coolant.

| Insert Type | Number of Passes Before the Edge Was Worn Out |
|---|---|
| A | 60 |
| B | 55 |
| D | 48 |
| E | 48 |

EXAMPLE 3

The same cutting conditions is used as in Example 2 with inserts of type A, B, C, D and F from the same batches as in Example 1. In this test, coolant is used during machining.

| Insert Type | Number of Passes | State of the Edge |
|---|---|---|
| A | 60 | minor chipping of edge line not worn out |
| B | 60 | undamaged edge line not worn out |
| C | 48 | fracture in cutting edge insert worn out |
| D | 24 | fracture in cutting edge insert worn out |
| F | 24 | fracture in cutting edge insert worn out |

EXAMPLE 4

Cemented carbide inserts of type A, B and G in Example 1 are tested in a turning test that causes deformation of the cutting edge leading to flaking of the coating and enhanced wear of the insert. The test is performed in a nodular cast iron SS0737 and for a certain combination of feed and cutting depth in a longitudinal turning operation, the highest possible cutting rate before deformation of the cemented carbide occurs is sought.

| Insert Type | Highest Possible Cutting Speed |
|---|---|
| A | 475 m/min |
| B | 450 m/min |
| G | 400 m/min |

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A cutting tool insert comprising a coating and a cemented carbide body, said cemented carbide body comprising WC, 5-10 weight % Co and <0.5 weight % cubic carbides of metals from groups IVb, Vb, or VIb of the periodic table with a highly W-alloyed binder phase having a CW-ratio of 0.75-0.93 and a surface composition of the cemented carbide body being well-defined, the amount of Co on the surface being within −4 weight % to +4 weight % of the nominal Co content of the body and said coating comprising:

a first, innermost, layer of $TiC_xN_yO_z$ with x+y+z=1 and y>x and z<0.1, with a thickness of 0.1-2 μm, and with equiaxed grains having a size <0.5 μm;

a layer of $TiC_xN_yO_z$ where x+y+z=1, and z=0, x>0.3 and y>0.3, with a thickness of 5-10 μm with columnar grains having a diameter of <2 μm;

a layer of $TiC_xN_yO_z$ where x+y+z=1, z<0.5 and x>y with a thickness of 0.1-2 μm and with equiaxed or needle-like grains having a size <0.5 μm;

a layer of smooth, textured, fine-grained $\alpha$-$Al_2O_3$ having a grain size of 0.5-2 μm with a thickness of 3-6 μm; and an outer layer of $TiC_xN_yO_z$ where x+y+z=1, z<0.05 with a thickness of 0.5-3 μm and a grain size <1 μm, the outer coating layer having been removed in at least the edge line so that the $Al_2O_3$ layer is on top along the cutting edge line and the outer layer of $TiC_xN_yO_z$ is the top layer on the clearance side.

2. The cutting tool insert of claim 1 wherein the $\alpha$-$Al_2O_3$ layer has a texture in (012)-direction and a texture coefficient TC(012) larger than 1.3.

3. A cutting tool insert comprising a coating and a cemented carbide body, said cemented carbide body comprising WC, 5-10 weight % Co and <0.5 weight % cubic carbides of metals from groups IVb, Vb, or VIb of the periodic table with a highly W-alloyed binder phase having a CW-ratio of 0.75-0.93 and a surface composition of the cemented carbide body being well-defined, the amount of Co on the surface being within −4 weight % to +4 weight % of the nominal Co content of the body and said coating comprising:

a first, innermost, layer of $TiC_xN_yO_z$ with x+y+z=1 and z<0.5 and y<0.1 with a thickness of 0.1-2 μm, and with equiaxed grains having a size <0.5 μm;

a layer of $TiC_xN_yO_z$ where x+y+z=1, and z=0, x>0.3 and y>0.3, with a thickness of 5-10 μm with columnar grains having a diameter of <2 μm;

a layer of $TiC_xN_yO_z$ where x+y+z=1, z<0.5 and x>y with a thickness of 0.1-2 μm and with equiaxed or needle-like grains having a size <0.5 μm;

a layer of smooth, textured, fine-grained $\alpha$-$Al_2O_3$ having a grain size of 0.5-2 μm with a thickness of 3-6 μm; and an outer layer of $TiC_xN_yO_z$ where x+y+z=1, z<0.05 with a thickness of 0.5-3 μm and a grain size <1 μm, the outer coating layer having been removed in at least the edge line so that the $Al_2O_3$ layer is on top along the cutting edge line and the outer layer of $TiC_xN_yO_z$ is the top layer on the clearance side.

4. The cutting tool insert of claim 1 wherein the outer $TiC_xN_yO_z$ layer comprises a multilayer of TiN/TiC/TiN.

5. The cutting tool insert of claim 1 wherein the binder phase has a CW ratio of from 0.8-0.9.

6. The cutting tool insert of claim 1 wherein the cobalt content of the cemented carbide body is 5-8 weight %.

7. A method of making a cutting insert comprising a cemented carbide body and a coating wherein a WC-Co-based cemented carbide body is sintered, said sintering including a cooling step which at least to below 1200° C. is performed in a hydrogen atmosphere of pressure 0.4-0.9 bar and thereafter coating said sintered body with a first, innermost, layer of $TiC_xN_yO_z$ with a thickness of 0.1-2 μm, with equiaxed grains with size <0.5 μm by CVD;

a layer of $TiC_xN_yO_z$ with a thickness of 4-12 μm with columnar grains and with a diameter of <5 μm deposited by MTCVD technique, using acetonitrile as the carbon and nitrogen source for forming the layer in a temperature range of 850-900° C.;

a layer of $TiC_xN_yO_z$ with a thickness of 0.1-2 μm with equiaxed or needle-like grains with size <0.5 μm, using CVD;

a layer of a smooth textured $\alpha$-$Al_2O_3$ textured in the direction (012), (104) or (110) with a thickness of 3-8 μm using CVD; and an outer layer of $TiC_xN_yO_z$ with a thickness of 0.5-3 μm, using CVD and thereafter removing the outer layer of $TiC_xN_yO_z$ on at least the cutting edge line so that the $Al_2O_3$ layer is on top along the cutting edge line and the outer layer of $TiC_xN_yO_z$ is the top layer on the clearance side of the cutting insert.

*8. The cutting tool insert of claim 3 wherein the $\alpha$-$Al_2O_3$ layer has a texture in (012)-direction and a texture coefficient TC(012) larger than 1.3.*

*9. The cutting tool insert of claim 3 wherein the outer $TiC_xN_yO_z$ layer comprises a multilayer of TiN/TiC/TiN.*

*10. The cutting tool insert of claim 3 wherein the binder phase has a CW ratio of from 0.8-0.9.*

*11. The cutting tool insert of claim 3 wherein the cobalt content of the cemented carbide body is 5-8 weight %.*

*12. The cutting tool insert of claim 7 wherein the outer $TiC_xN_yO_z$ layer comprises a multilayer of TiN/TiC/TiN.*

*13. The cutting tool insert of claim 7 wherein the binder phase has a CW ratio of from 0.8-0.9.*

*14. The cutting tool insert of claim 7 wherein the cobalt content of the cemented carbide body is 5-8 weight %.*

* * * * *